(12) United States Patent
Karino et al.

(10) Patent No.: US 10,566,412 B2
(45) Date of Patent: Feb. 18, 2020

(54) HIGH VOLTAGE JUNCTION FIELD EFFECT TRANSISTOR (JFET) WITH SPIRAL VOLTAGE DIVIDER

(71) Applicant: FUJI ELECTRIC CO., LTD., Kawasaki-shi, Kanagawa (JP)

(72) Inventors: Taichi Karino, Matsumoto (JP); Masaharu Yamaji, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/365,115

(22) Filed: Nov. 30, 2016

(65) Prior Publication Data

US 2017/0207296 A1    Jul. 20, 2017

(30) Foreign Application Priority Data

Jan. 18, 2016   (JP) .................. 2016-007005

(51) Int. Cl.
*H01L 49/02*    (2006.01)
(52) U.S. Cl.
CPC .............. *H01L 28/24* (2013.01); *H01L 28/20* (2013.01)
(58) Field of Classification Search
CPC ........ H01L 29/808; H01L 28/20; H01L 28/24
See application file for complete search history.

(56) References Cited

U.S. PATENT DOCUMENTS

| | | | | |
|---|---|---|---|---|
| 7,803,643 B2* | 9/2010 | Hall | ................... | H01L 27/0288 438/10 |
| 9,048,732 B2* | 6/2015 | Lee | ...................... | H02M 7/217 |
| 9,461,104 B2* | 10/2016 | Palumbo | ............... | H01L 29/405 |
| 2006/0163691 A1* | 7/2006 | Hall | .................... | H01L 27/0288 257/528 |
| 2008/0117653 A1* | 5/2008 | Saito | ..................... | H01L 29/405 363/20 |
| 2009/0273059 A1* | 11/2009 | Komuro | .............. | H01L 27/0682 257/533 |
| 2009/0315080 A1* | 12/2009 | Stribley | ............. | H01L 27/0203 257/208 |
| 2012/0098071 A1* | 4/2012 | Aggarwal | ........... | H01L 27/0629 257/369 |

(Continued)

FOREIGN PATENT DOCUMENTS

JP   2008-153636 A   7/2008
WO    2014203487 A1  12/2014

*Primary Examiner* — Cuong Q Nguyen
*Assistant Examiner* — Shih Tsun A Chou
(74) *Attorney, Agent, or Firm* — Rabin & Berdo, P.C.

(57) ABSTRACT

An interlayer insulating film is disposed on a LOCOS oxide film covering an n-type drift region of a JFET. A polysilicon resistor having a spiral planar shape is disposed in the interlayer insulating film. A spiral wire in an outermost circumference of the polysilicon resistor is covered by a source electrode wire that extends on the interlayer insulating film. An end of the polysilicon resistor is electrically connected to a drain electrode wire. A ground terminal wire and a voltage division terminal wire are electrically connected to a spiral wire farther on an inner circumference side by one or more wires than the spiral wire. A portion farther on an inner circumference side than the spiral wire is used as a resistive element, and voltage for an input pad of the JFET is thereby divided to be taken out as a potential of the voltage division terminal wire.

10 Claims, 13 Drawing Sheets

(56) References Cited

U.S. PATENT DOCUMENTS

| | | | |
|---|---|---|---|
| 2013/0032922 A1* | 2/2013 | Kawahara | H01L 21/761 257/492 |
| 2013/0070429 A1 | 3/2013 | Depetro et al. | |
| 2015/0002213 A1* | 1/2015 | Zhang | H01L 23/5252 327/525 |
| 2015/0311197 A1* | 10/2015 | Saito | H01L 27/0611 323/282 |
| 2016/0218169 A1* | 7/2016 | Yen | H01L 28/10 |
| 2017/0194349 A1* | 7/2017 | Chen | H01L 27/11807 |

* cited by examiner

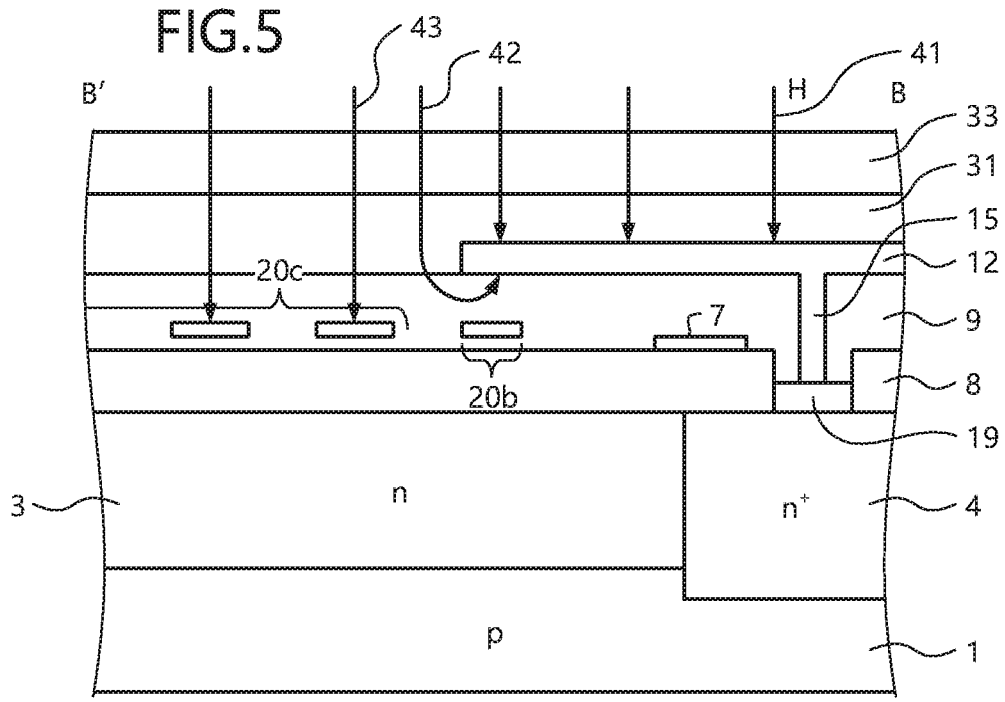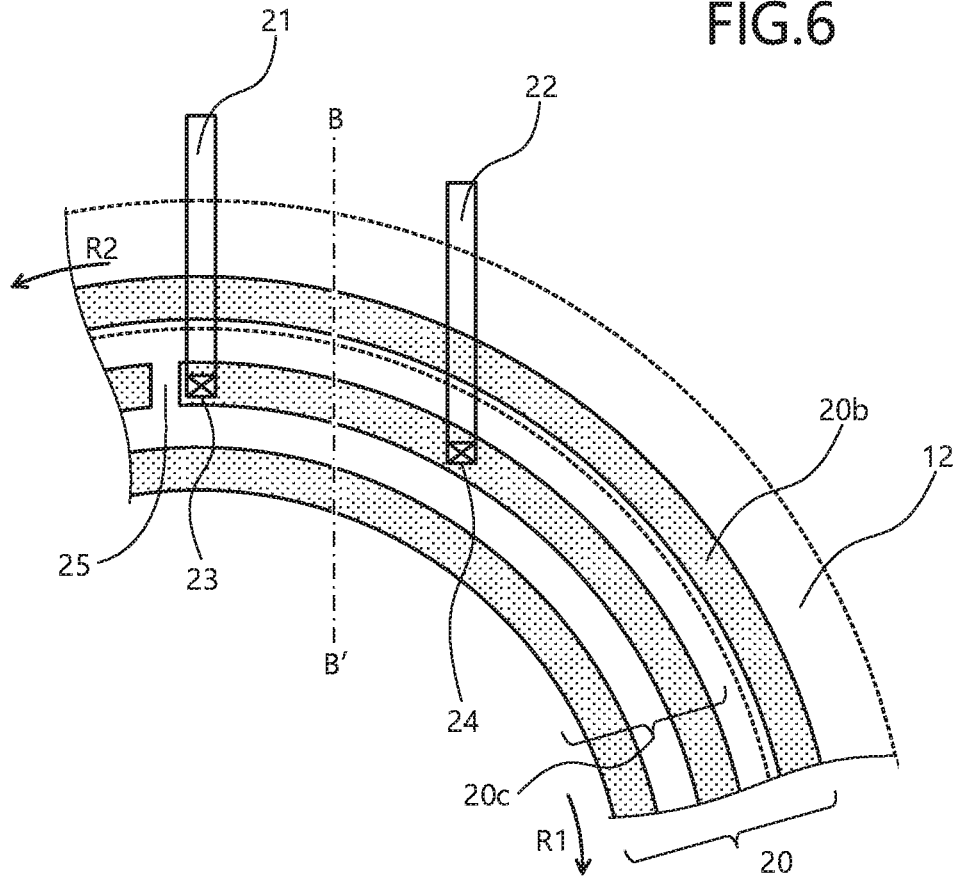

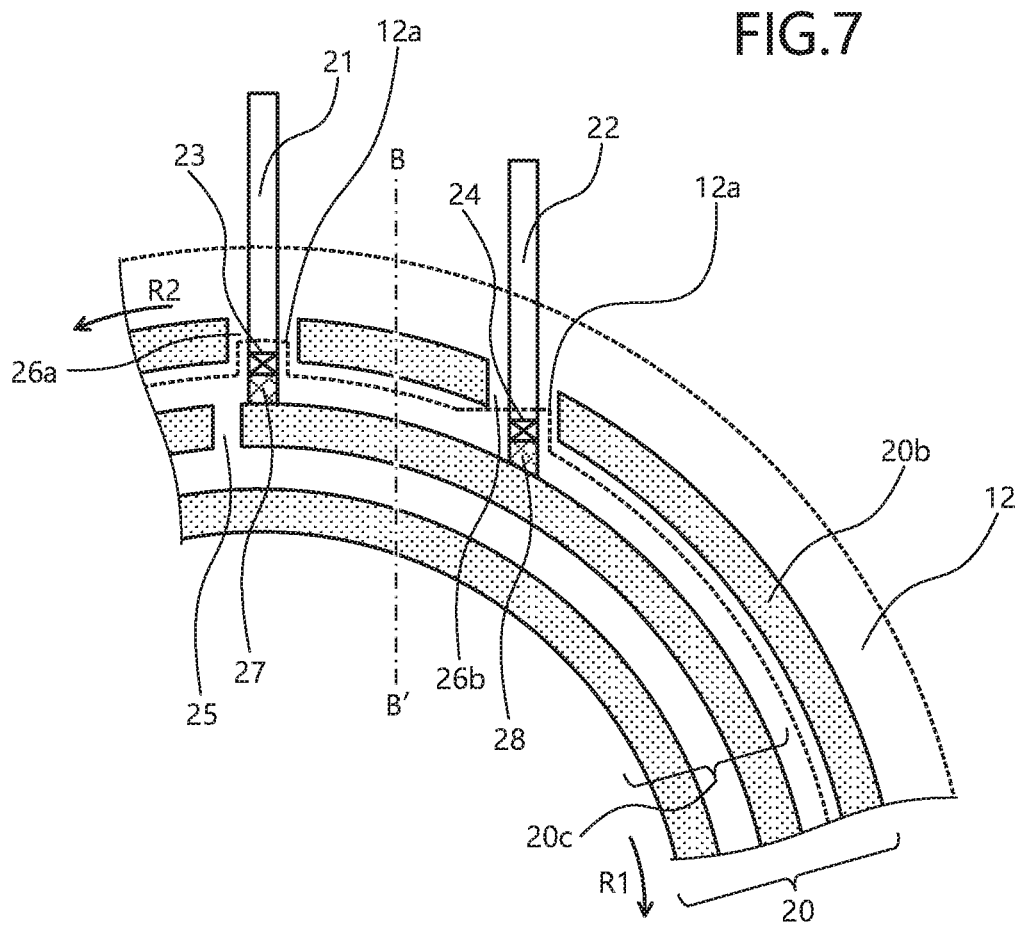

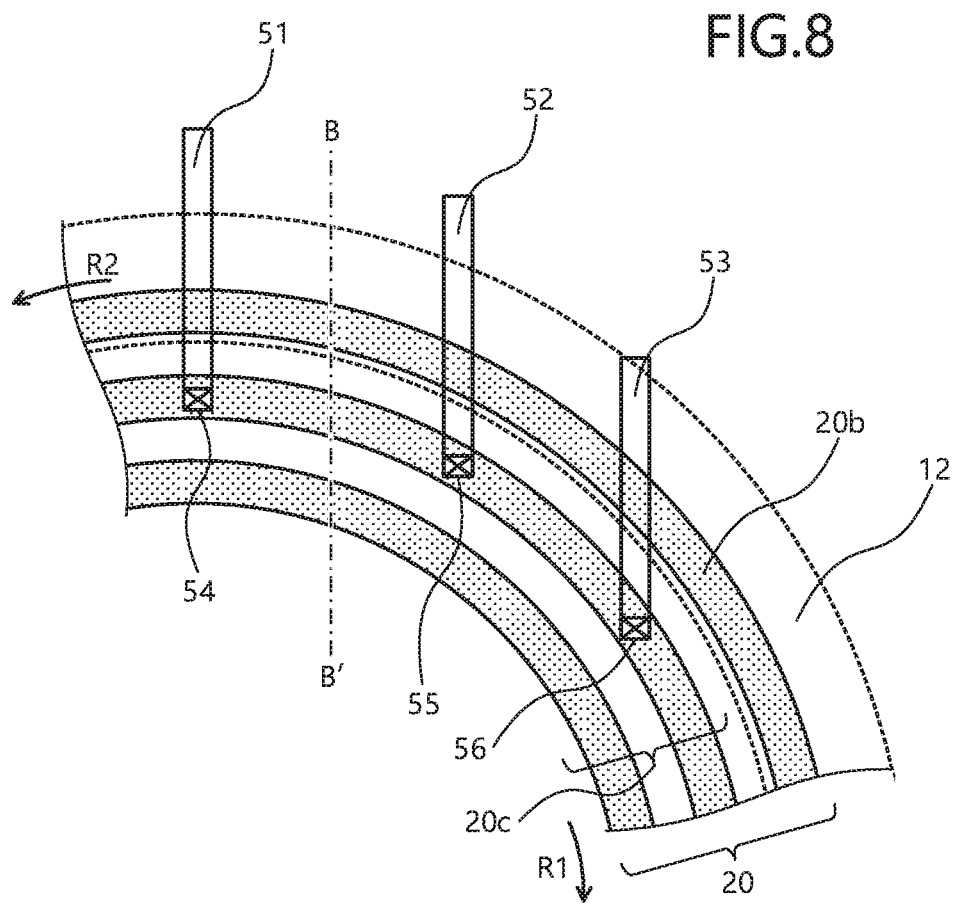

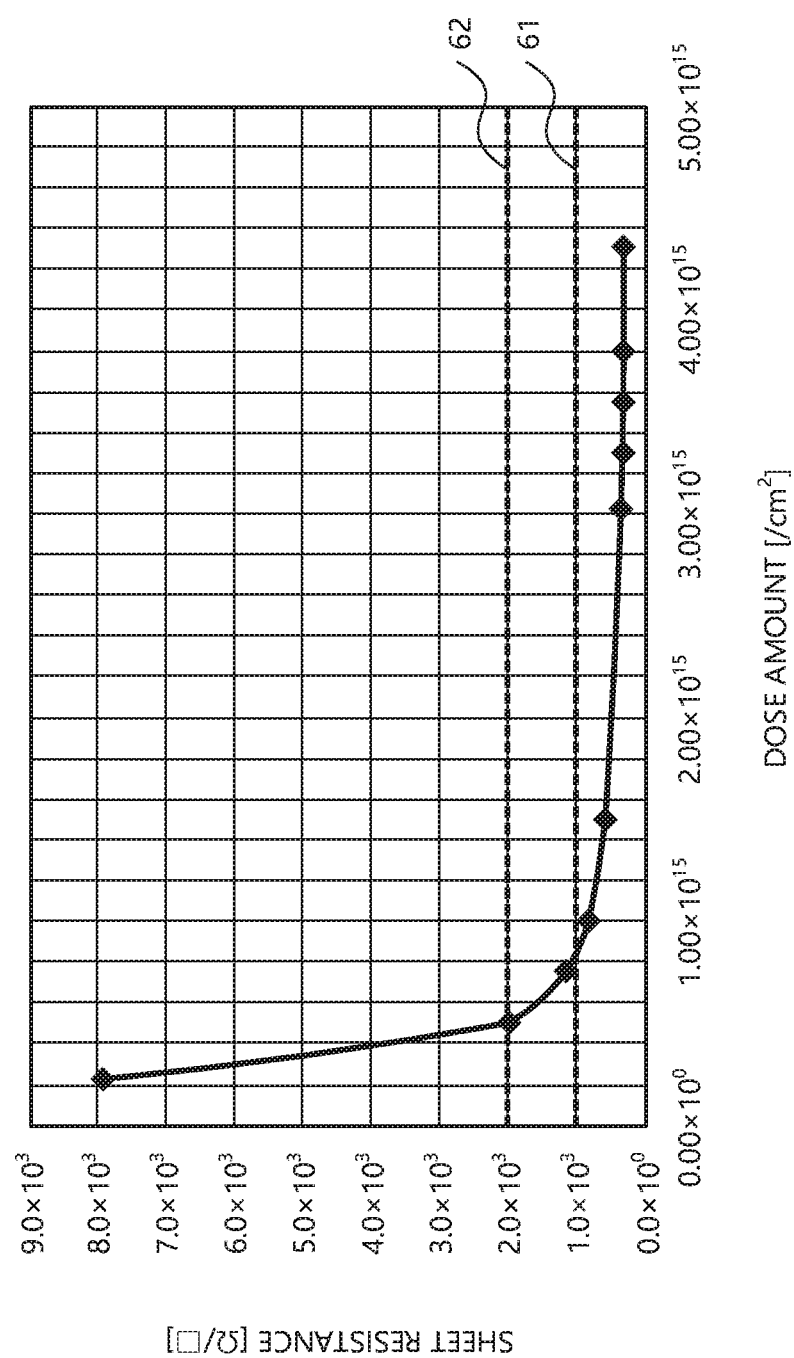

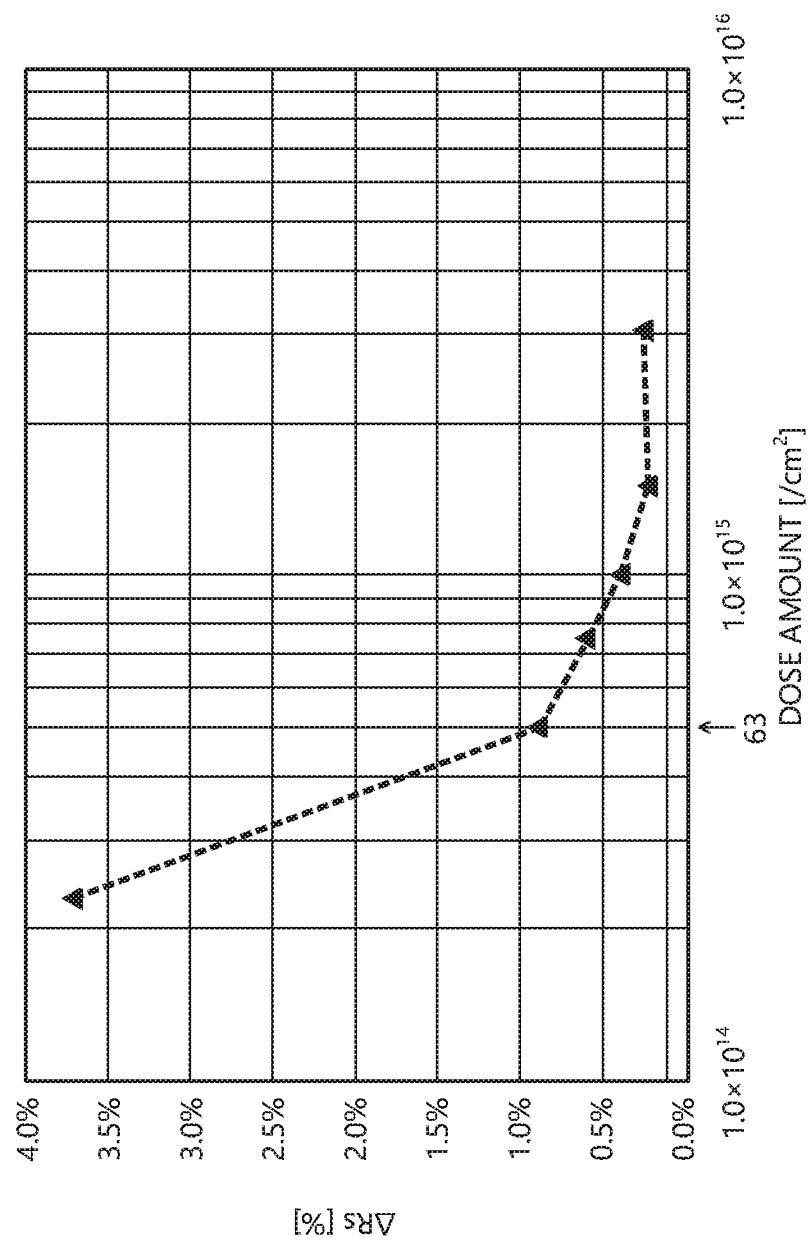

US 10,566,412 B2

HIGH VOLTAGE JUNCTION FIELD EFFECT TRANSISTOR (JFET) WITH SPIRAL VOLTAGE DIVIDER

CROSS REFERENCE TO RELATED APPLICATIONS

This application is based upon and claims the benefit of priority of the prior Japanese Patent Application No. 2016-007005, filed on Jan. 18, 2016, the entire contents of which are incorporated herein by reference.

BACKGROUND OF THE INVENTION

1. Field of the Invention

The embodiments discussed herein relate to a semiconductor device.

2. Description of the Related Art

Known as a start-up element of a start-up circuit used in a conventional switching power supply device, one high voltage junction field effect transistor (JFET) has plural source regions disposed in a planar layout on a circular perimeter along the circumference of an input pad having a circular planar shape (see, e.g., Japanese Laid-Open Patent Publication No. 2008-153636). In Japanese Laid-Open Patent Publication No. 2008-153636, a resistive element connected in parallel to the start-up element is disposed between the input pad and a gate electrode wire of the high voltage JFET. The resistive element includes a thin film resistor including polysilicon (poly-Si) or the like disposed to form a spiral planar shape on an edge termination structure of the start-up element.

The structure of the JFET forming the conventional start-up element will be described with reference to FIGS. 14 to 16. FIG. 14 is a plan diagram of a planar layout of the conventional semiconductor device. FIG. 15 is a cross-sectional view taken along a cutting line AA-AA' in FIG. 14. FIG. 16 is an enlarged plan diagram of a portion of FIG. 14. In FIGS. 14 and 16, metal wires are indicated by dotted lines. FIG. 16 depicts a planar layout of a portion near an outer peripheral end of the resistive element including the thin film resistor 120 including polysilicon (hereinafter, referred to as "polysilicon resistor"). In a conventional JFET 100 depicted in FIGS. 14 to 16, a p-type gate region 102 is selectively disposed in the surface layer of the front surface of a p-type semiconductor substrate 101. Reference numeral "106" denotes a p$^+$-type contact region inside the p-type gate region 102.

An n-type drift layer 103 is selectively disposed so as to have a predetermined width and enter into a portion of the p-type gate region 102, in the surface layer of the front surface of the p-type semiconductor substrate 101. An n$^+$-type source region 104 is selectively disposed in the surface layer of the front surface of the p-type semiconductor substrate 101, at the point into which the n-type drift region 103 enters. An n$^+$-type drain region 105 that faces the n$^+$-type source region 104 sandwiching the n-type drift region 103 therebetween is selectively disposed in the surface layer of the front surface of the p-type semiconductor substrate 101, at a point away from the n$^+$-type source region 104. The n$^+$-type source region 104 is disposed on the circumference at equal intervals from the n$^+$-type drain region 105.

A gate polysilicon electrode 107 is disposed to extend over the p-type gate region 102 and the n-type drift region 103, at the position not depicted at which the n-type drift region 103 contacts the p-type gate region 102. At the position at which the n$^+$-type source region 104 is disposed, the gate polysilicon electrode 107 is disposed on a local oxidation of silicon (LOCOS) oxide film 108 on the n-type drift region 103. An interlayer insulating film 109 is disposed on the regions that are the LOCOS oxide film 108, the gate polysilicon electrode 107, and the surface layer of the front surface of the p-type semiconductor substrate 101.

In the interlayer insulating film 109, a polysilicon resistor 120 is disposed in a portion that faces the n-type drift region 103 in the depth direction, sandwiching the LOCOS oxide film 108 therebetween. The polysilicon resistor 120 has a planar shape forming a spiral extending from the inner side (the side of the n$^+$-type drain region 105) toward the outer side (the side of the n$^+$-type source region 104). The polysilicon resistor 120, at the outer peripheral end thereof, is electrically connected to a ground terminal wire 121 through a ground (ground) contact portion 123 that penetrates the interlayer insulating film 109. The polysilicon resistor 120 is connected to a voltage division terminal wire 122 through a voltage division point contact portion 124 closer to the inner peripheral end side than the ground contact portion 123 in an outermost circumference 120$b$.

A gate electrode wire 110, a drain electrode wire 111, and a source electrode wire 112 are disposed on the interlayer insulating film 109. The gate electrode wire 110 is disposed to surround the n$^+$-type drain region 105, the n-type drift region 103, and the n$^+$-type source region 104, and faces the p-type gate region 102 in the depth direction, sandwiching the interlayer insulating film 109 therebetween. The gate electrode wire 110 is electrically connected to the p-type gate region 102 and the gate polysilicon electrode 107 through a gate contact portion 113 that penetrates the interlayer insulating film 109. The gate electrode wire 110 is normally grounded.

The drain electrode wire 111 faces the n$^+$-type drain region 105 in the depth direction, sandwiching the interlayer insulating film 109 therebetween. The drain electrode wire 111 is electrically connected to the n$^+$-type drain region 105 through a drain contact portion 114 that penetrates the interlayer insulating film 109. The drain electrode wire 111 extends outward on the interlayer insulating film 109, and faces an innermost circumference 120$a$ of the polysilicon resistor 120 in the depth direction, sandwiching the interlayer insulating film 109 therebetween. The drain electrode wire 111 is electrically connected to the polysilicon resistor 120 through a resistive element contact portion 116 that penetrates the interlayer insulating film 109.

The source electrode wire 112 is disposed to surround the n$^+$-type drain region 105 and the n-type drift region 103, and faces the n$^+$-type source region 104 in the depth direction, sandwiching the interlayer insulating film 109. The source electrode wire 112 is electrically connected to the n$^+$-type source region 104 through a source contact portion 115 that penetrates the interlayer insulating film 109. The source electrode wire 112 extends inward on the interlayer insulating film 109, and faces the outermost circumference 120$b$ of the polysilicon resistor 120 and the gate polysilicon electrode 107 in the depth direction, sandwiching the interlayer insulating film 109 therebetween.

SUMMARY OF THE INVENTION

According to one aspect of the present invention, a semiconductor device includes: a first region of a first conductivity type, selectively disposed in a surface layer of a semiconductor substrate; a second region of a second conductivity type, disposed in the surface layer of the semiconductor substrate in contact with the first region; a third region of the second conductivity type, disposed in the surface layer of the semiconductor substrate to face the second region; a fourth region of the second conductivity type, disposed in the surface layer of the semiconductor substrate, between the first region and the third region; an insulating film covering the fourth region; a resistive body embedded in the insulating film; a first electrode electrically connected to the third region and a first end of the resistive body; a second electrode electrically connected to the second region and covering a second end side of the resistive body through the insulating film; a third electrode electrically connected to the first region; and a plurality of resistor connection wires each electrically connected to a portion of the resistive body, excluding a portion covered by the second electrode.

In the semiconductor device, the resistive body is disposed to have a spiral planar shape. The second electrode covers a spiral wire in an outermost circumference of the resistive body through the insulating film, and the resistor connection wires are electrically connected to a spiral wire farther on an inner circumference side by one or more wires than the outermost circumference of the resistive body.

A semiconductor device according to another aspect of the invention includes an insulating film disposed on a surface of a semiconductor substrate; a resistive body disposed in the insulating film and having a spiral planar shape; a first electrode electrically connected to an end of the resistive body; and a plurality of resistor connection wires that are each electrically connected to a spiral wire farther on an inner circumference side by one or more wires than an outermost circumference of the resistive body.

In the semiconductor device, an outer peripheral end side of an outermost circumference side of the resistive body, farther outward than a connection point connected to the resistor connection wire, is separated from an inner peripheral end side more than the connection point.

In the semiconductor device, the resistor connection wire is electrically connected to the resistive body through a polysilicon layer drawn in a direction away from the spiral wire of the resistive body. The polysilicon layer is a low resistance layer chemically changed to a salicide or has an impurity concentration is set to be high.

In the semiconductor device, sheet resistance of the resistive body is equal to or higher than 1 k$\Omega$/□.

In the semiconductor device, the resistive body includes polysilicon.

In the semiconductor device, the second electrode and the third electrode are connected to each other.

BRIEF DESCRIPTION OF THE DRAWINGS

FIG. 5 is a cross-sectional view of a state in the course of manufacture of the semiconductor device according to the first embodiment;

FIG. 6 is a plan diagram of a planar layout of a main portion of the semiconductor device according to a second embodiment;

FIG. 7 is a plan diagram of a planar layout of a main portion of the semiconductor device according to a third embodiment;

FIG. 8 is a plan diagram of a planar layout of a main portion of the semiconductor device according to a fourth embodiment;

FIG. 9 is an explanatory diagram of a relation between impurity dose amount and sheet resistance of a resistive element;

FIG. 10 is a characteristics diagram of a relation between the impurity dose amount for a polysilicon resistor and variation of the sheet resistance of the resistive element;

DETAILED DESCRIPTION OF THE INVENTION

Figure 1:
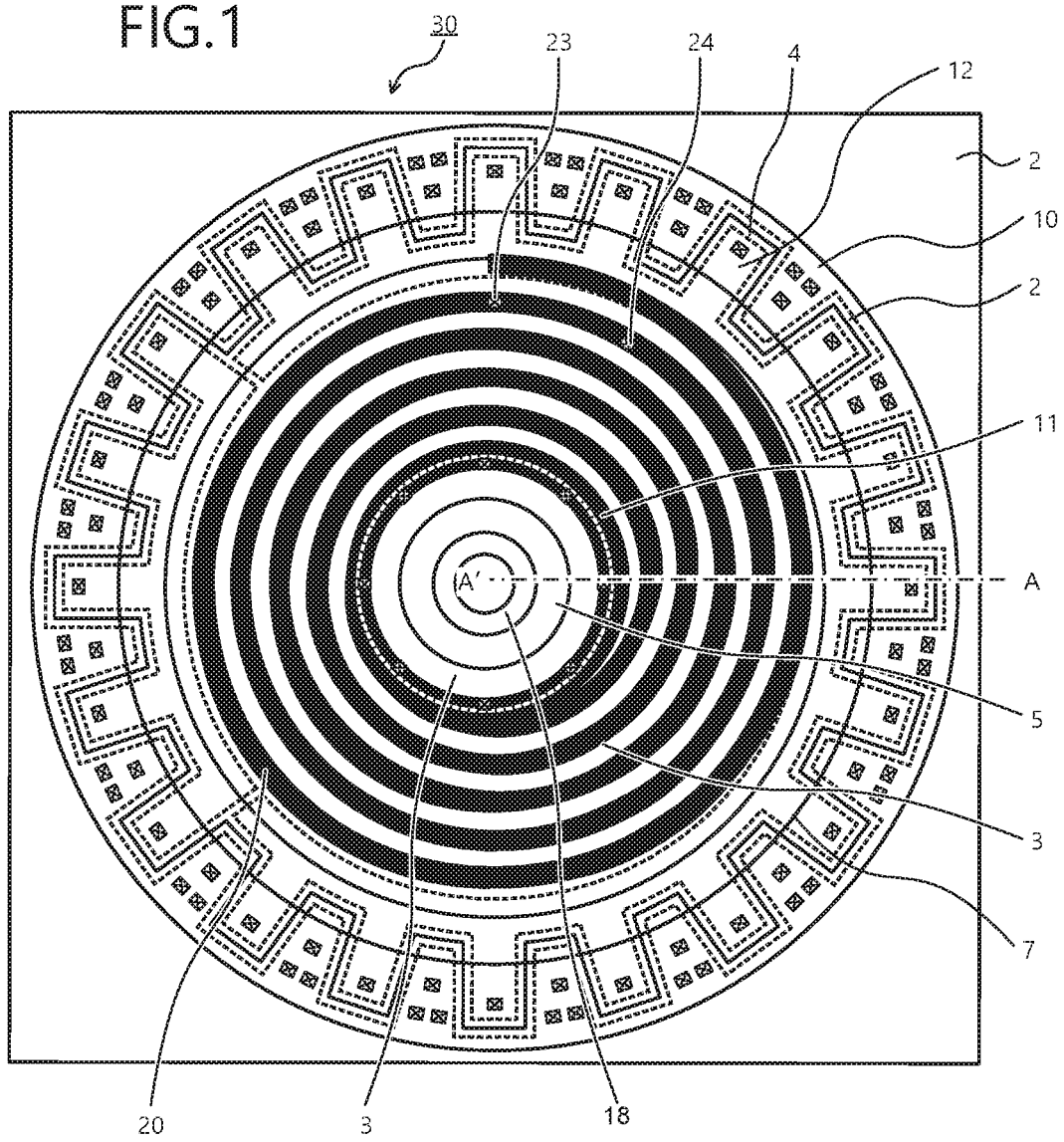
FIG. 1 is a plan diagram of a planar layout of a semiconductor device according to a first embodiment.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 2:
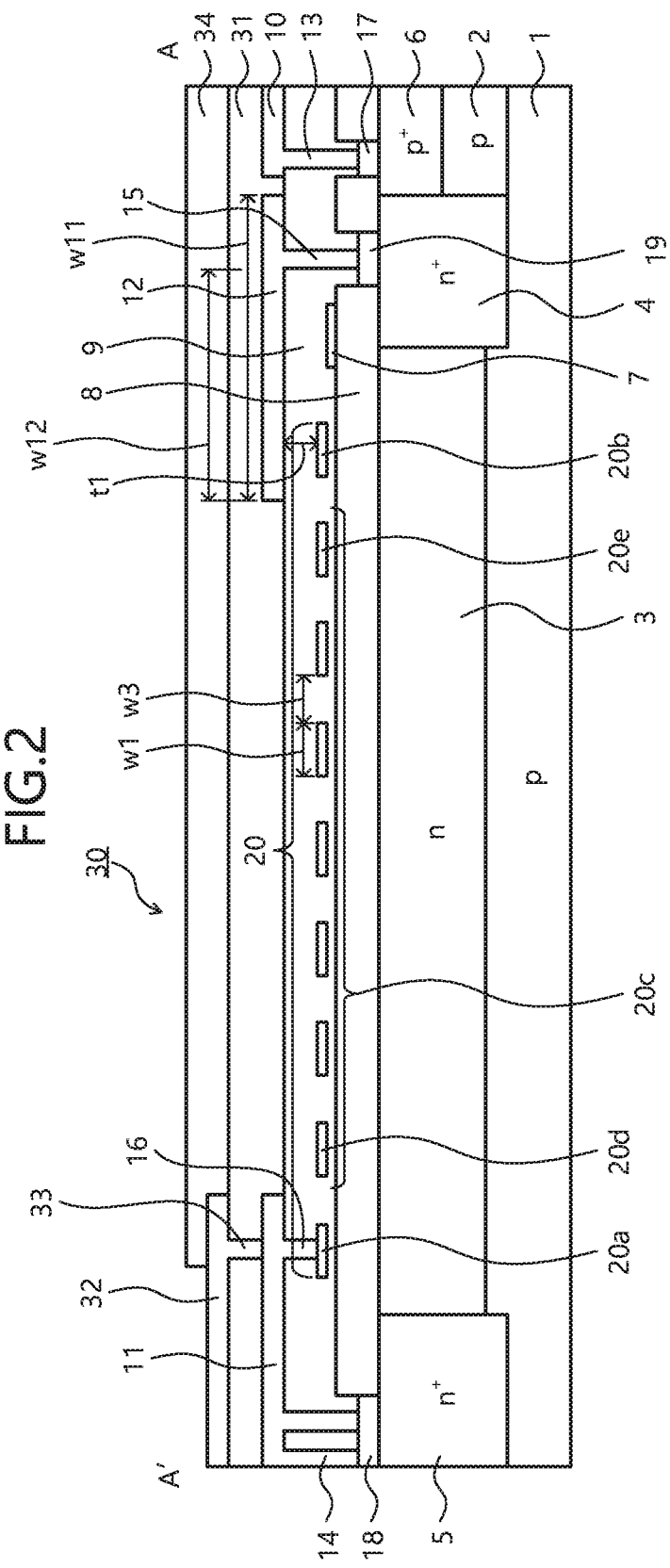
FIG. 2 is a cross-sectional view taken along a cutting line A-A' of FIG. 1.
Figure 3:
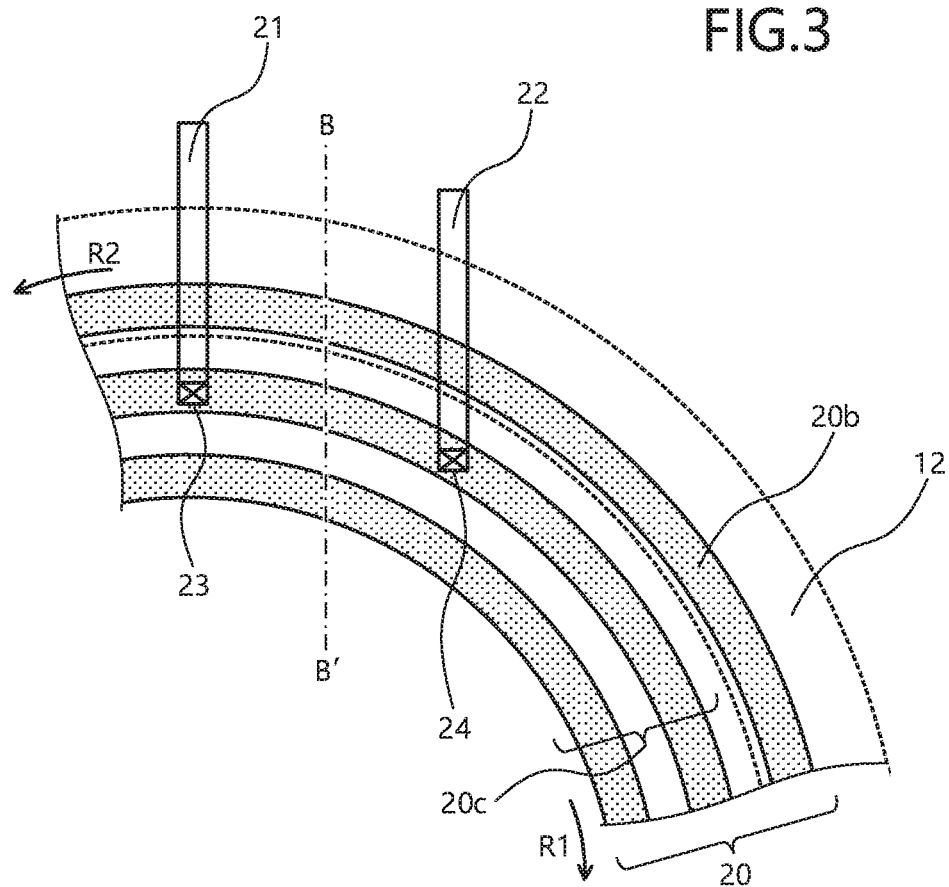
FIG. 3 is an enlarged view of a planar diagram of a portion of FIG. 1.

The structure of the semiconductor device according to a first embodiment will be described with reference to FIGS. 1 to 3. FIG. 1 is a plan diagram of a planar layout of the semiconductor device according to the first embodiment. FIG. 2 is a cross-sectional view taken along a cutting line A-A' of FIG. 1. FIG. 3 is an enlarged view of a planar diagram of a portion of FIG. 1. Metal wires are indicated by dotted lines in FIGS. 1 and 3. FIG. 3 depicts the planar layout of a portion near an end of the outer side (the side of an n$^+$-type source region 4) of a thin film resistor (a polysilicon resistor (a resistive body)) 20 that includes polysilicon (poly-Si). In this embodiment, description will be given taking an example of an integrated circuit (IC) that has a JFET 30 to be a start-up element of a start-up circuit used in a switching power supply device not depicted and the polysilicon resistor 20 to be a resistive element to monitor the input voltage to the JFET 30 (voltage sensing), disposed on a single p-type semiconductor substrate (a semiconductor chip) 1.

The semiconductor device according to the first embodiment depicted in FIGS. 1 to 3 includes the JFET 30 having components from an n$^+$-type source region (a second region) 4 to an n$^+$-type drain region (a third region) configured in an n-type diffusion region, and the polysilicon resistor 20 to be a resistive element for the voltage sensing of the JFET 30. For example, a p-type gate region (a first region) 2 is selectively disposed in the surface layer of the front surface of the p-type semiconductor substrate 1. A p$^+$-type contact region 6 is selectively disposed inside the p-type gate region 2. An n-type drift region 4 is selectively disposed to have a predetermined width and enter into portions of the p-type gate region 2 (for example, 20 points), in the surface layer of the front surface of the p-type semiconductor substrate 1. The n$^+$-type source region 4 is selectively disposed at the points into which the n-type drift regions 3 enter, in the surface layer of the front surface of the p-type semiconductor substrate 1.

An n$^+$-type drain region 5 facing the n$^+$-type source region 4 sandwiching the n-type drift region 3 therebetween is selectively disposed at a point away from the n$^+$-type source region 4, in the surface layer of the front surface of the p-type semiconductor substrate 1. The n$^+$-type drain region 5 has a circular planar shape. The n$^+$-type source region 4 is disposed in, for example, a gear-like planar layout on a circumference at equal intervals from the n$^+$-type drain region 5. A gate polysilicon electrode 7 is disposed at a position not depicted at which the n-type drift region 3 contacts the p-type gate region 2, and extends on the p-type gate region 2 and the n-type drift region 3. At the position at which the n$^+$-type source region 4 is disposed, the gate polysilicon electrode 7 is disposed on a LOCOS oxide film (an insulating film) 8 on the n-type drift region 3.

The gate polysilicon electrode 7 is disposed in a substantially ring-like planar layout that surrounds the n$^+$-type drain region 5 and the n-type drift region 3. The gate polysilicon electrode 7 has a function of spreading the expansion of a depletion layer that spreads from a pn-junction between the p-type gate region 2 and the n$^+$-type source region 4 when the pn-junction is inversely biased by increasing the potential of the source electrode wire 12 described later. Any increase of the potential of the source electrode wire 12 is thereby suppressed. The interlayer insulating film (the insulating film) 9 is disposed on the LOCOS oxide film 8, the gate polysilicon electrode 7, the p-type gate region 2 (the p$^+$-type contact region 6), the n$^+$-type source region 4, and the n$^+$-type drain region 5. A gate electrode wire (a third electrode) 10, a drain electrode wire (a first electrode) 11, and a source electrode wire (a second electrode) 12 are disposed on the interlayer insulating film 9.

A gate electrode wire 10 is disposed to surround the n$^+$-type drain region 5, the n-type drift region 3, and the n$^+$-type source region 4, and faces the p-type gate region 2 in the depth direction, sandwiching the interlayer insulating film 9 therebetween. The gate electrode wire 10 is electrically connected to the p$^+$-type contact region 6 and the gate polysilicon electrode 7 through a gate contact portion 13 and a contact plug 17 that penetrate the interlayer insulating film 9. The gate electrode wire 10 is disposed in a planar layout that enters the inner side (the side of the n$^+$-type drain region 5) having a predetermined width along the gear-like planar shaped n$^+$-type source region 4 and that surrounds the source electrode wire 12. The gate electrode wire 10 is grounded normally.

The drain electrode wire 11 faces the n$^+$-type drain region 5 in the depth direction, sandwiching the interlayer insulating film 9 therebetween. The drain electrode wire 11 is electrically connected to the n$^+$-type drain region 5 through a drain contact portion 14 and a contact plug 18 that penetrate the interlayer insulating film 9. The drain electrode wire 11 extends to jut outward on the interlayer insulating film 9, and faces a spiral wire 20a in the innermost circumference of the polysilicon resistor 20 described later in the depth direction, sandwiching the interlayer insulating film 9 therebetween. The drain electrode wire 11 is electrically connected to the spiral wire 20a in the innermost circumference of the polysilicon resistor 20 through a resistive element contact portion 16 that penetrates the interlayer insulating film 9. The drain electrode wire 11 has a substantially circular planar shape.

The source electrode wire 12 is disposed to surround the n$^+$-type drain region 5 and the n-type drift region 3, and faces the n$^+$-type source region 4 in the depth direction, sandwiching the interlayer insulating film 9 therebetween. The source electrode wire 12 is electrically connected to the n$^+$-type source region 4 through a source contact portion 15 and a contact plug 19 that penetrate the interlayer insulating film 9. The source electrode wire 12 extends to jut inward on the interlayer insulating film 9, and faces a spiral wire 20b in the outermost circumference of the polysilicon resistor 20 and the gate polysilicon electrode 7 in the depth direction, sandwiching the interlayer insulating film 9 therebetween. The source electrode wire 12 is disposed in a planar layout in which the source electrode wire 12 enters the outer side and has a predetermined width along the gear-like planar shaped n$^+$-type source region 4.

The source electrode wire 12 has a predetermined width w11 capable of causing current of the JFET 30 to flow sufficiently to the extent that occurrence of disconnection of the source electrode wire 12 and partial misalignment (what-is-called aluminum sliding) of the source electrode wire 12 may be suppressed. Because the gate electrode wire 10 is disposed on the outer side of the source electrode wire 12, the source electrode wire 12 extends to jut inward on the interlayer insulating film 9. On the other hand, the difference in the potential between the source electrode wire 12 and the polysilicon resistor 20 increases as the source electrode wire 12 juts inward more deeply, and the breakdown may occur. Preferably, a jutting width w12 of the inward jutting of the source electrode wire 12 is properly set based on the difference in the potential between the jutting portion jutting inward of the source electrode wire 12 and the polysilicon resistor 20, a thickness t1 of the interlayer insulating film 9 in the portion sandwiched between the jutting portion jutting inward of the source electrode wire 12 and the polysilicon resistor 20, and the like.

The metal wires (the gate electrode wire 10, the drain electrode wire 11, and the source electrode wire 12) are each a layered metal film formed by sequentially stacking, for example, a barrier metal, an aluminum (Al) metal film, and an anti-reflection film. Of the layered metal film, the portion embedded in the contact hole acts as the gate contact portion 13, the drain contact portion 14, the source contact portion 15, and the resistive element contact portion 16. The contact plug 17, the contact plug 18, and the contact plug 19 are each a layered metal film formed by sequentially stacking a barrier metal and a tungsten (W) film. The aluminum metal film is a metal film that includes aluminum, and may be, for example, an aluminum-copper (Al—Cu) film or an aluminum-silicon-copper (Al—Si—Cu) film.

The barrier metal has a function of preventing diffusion of metal atoms toward the side of the p-type semiconductor substrate 1 and interaction between the p-type semiconductor substrate 1 and the metal film. The barrier metal may be a layered film formed by sequentially stacking, for example, a titanium (Ti) film and a titanium nitride (TiN) film. The barrier metal of each of the contact plug 17, the contact plug 18, and the contact plug 19 is chemically changed into a silicide (reduction of resistance) by a reaction with the semiconductor portion. The anti-reflection film may be a layered film formed by sequentially stacking a titanium film and a titanium nitride film. The anti-reflection film has a function of preventing diffuse reflection of light on the aluminum metal film when a resist mask for the patterning of the aluminum metal film is exposed.

Preferably, the metal wires are each disposed at a position deeper than the uppermost chip surface (in this case, the surface of an interlayer insulating film 34 disposed on an interlayer insulating film 31). The reason for this is that effects of mobile ions in a sealing material for filling on an interlayer insulating film 34 may be mitigated during, for example, a high-temperature and high-voltage application test. The metal wires may each be a multi-layered wire. FIG. 2 depicts a case where a multi-layered wire is used as the drain electrode wire. For example, the interlayer insulating film 31 is further disposed on the interlayer insulating film 9 and the metal wires. A drain electrode wire 32 facing the drain electrode wire 11 in the depth direction, sandwiching the interlayer insulating film 31 therebetween is disposed on the interlayer insulating film 31. The drain electrode wire 32 is electrically connected to the drain electrode wire 11 through a drain contact portion 33 that penetrates the interlayer insulating film 31.

Inside the interlayer insulating film 9, the polysilicon resistor 20 is disposed in a portion facing the n-type drift region 3 in the depth direction, sandwiching the LOCOS oxide film 8 therebetween. The polysilicon resistor 20 is disposed farther on the inner side than the gate polysilicon electrode 7 and away from the gate polysilicon electrode 7. The polysilicon resistor 20 is disposed in spiral planar shape surrounding the $n^+$-type drain region 5. As described above, the spiral wire 20a in the innermost circumference of the polysilicon resistor 20 is covered by the drain electrode wire 11 that extends on the interlayer insulating film 9 and is electrically connected to the drain electrode wire 11 through the resistive element contact portion 16.

As described above, the spiral wire 20b in the outermost circumference of the polysilicon resistor 20 is covered by the source electrode wire 12 that extends on the interlayer insulating film 9. The inner diameter of the polysilicon resistor 20 is smaller than the diameter of the drain electrode wire 11 and the outer diameter of the polysilicon resistor 20 is larger than the inner diameter of the source electrode wire 12, to an extent that the resistive element contact portion 16 for the drain electrode wire 11 may be disposed. The spiral wire 20a in the innermost circumference of the polysilicon resistor 20 refers to the spiral wire that is positioned on the innermost circumference side of the spiral wire of the polysilicon resistor 20 and that is not adjacent to any other spiral wire on the inner circumference side thereof. The spiral wire 20b in the outermost circumference of the polysilicon resistor 20 refers to the spiral wire that is positioned on the outermost circumference side of the spiral wire of the polysilicon resistor 20 and that is not adjacent to any other spiral wire on the outer circumference side thereof.

When voltage input to the input pads (the drain electrode wires 11 and 32) of the JFET 30 is sensed using a voltage sensing circuit (an internal circuit, not depicted) connected to the polysilicon resistor 20, the polysilicon resistor 20 is connected in parallel to the JFET 30. For example, the polysilicon resistor 20 has one end thereof electrically connected to the drain electrode wire 11, has the spiral wire on the side of the other end connected to a ground terminal wire (a resistor connection wire) 21, and has a portion in the middle thereof connected to a voltage division terminal wire (another resistor connection wire) 22. The spiral wire 20a in the innermost circumference of the polysilicon resistor 20 is chemically changed into the silicide by the resistive element contact portion 16 to have reduced resistance, and presents a resistance value that is different from that of the spiral wire on the outer circumference side than the spiral wire 20a on the innermost circumference.

The resistance value of the spiral wire 20b in the outermost circumference of the polysilicon resistor 20 varies as described later by being covered by the source electrode wire 12. A portion is therefore used as the resistive element, such as that from a spiral wire 20d farther on the outer circumference side by one wire than the spiral wire 20a in the innermost circumference of the polysilicon resistor 20 to a spiral wire 20e farther on the inner circumference side by one wire than the spiral wire 20b in the outermost circumference thereof. The ground terminal wire 21 is therefore electrically connected to a spiral wire 20c on the inner circumference side by one or more wire(s) than the spiral wire 20b in the outermost circumference of the polysilicon resistor 20 through a ground (grounding) contact portion 23 that penetrates the interlayer insulating film 9. The voltage division terminal wire 22 is electrically connected to the spiral wire 20c farther on the inner circumference side by one or more wire(s) than the spiral wire 20b in the outermost circumference of the polysilicon resistor 20 through a voltage division point contact portion 24 that penetrates the interlayer insulating film 9. The voltage division point contact portion 24 is positioned farther on an inner peripheral end side R1 than the ground contact portion 23 of the polysilicon resistor 20.

The ground terminal wire 21 and the voltage division terminal wire 22 both form contacts using the spiral wire 20c not covered by the source electrode wire 12, of the polysilicon resistor 20. The ground terminal wire 21 is grounded normally. The voltage division terminal wire 22 is the terminal to sense the input voltage to the input pad of the JFET 30 and divides the input voltage to output a divided voltage to the voltage sensing circuit. The potential of the voltage division terminal wire 22 output to the voltage sensing circuit becomes higher as the voltage division terminal wire 22 is connected to a position closer to the spiral wire 20a in the innermost circumference of the polysilicon resistor 20. The voltage division terminal wire 22 is therefore connected to a position at which the input voltage to the input pad of the JFET 30 may be divided to acquire a voltage lower than the breakdown voltage of the voltage sensing circuit. For example, the voltage division terminal wire 22 is connected to a position to take out a potential to be $\frac{1}{250}$ of the input voltage to the input pad of the JFET 30.

The ground terminal wire 21 and the voltage division terminal wire 22 are each disposed in a layer different from that of each other. For example, the source electrode wire 21 may be disposed in a first layer of the multi-layered wire and the ground terminal wire 21 and the voltage division terminal wire 22 may be disposed in a second layer of the multi-layered wire. In this case, for example, the interlayer insulating film 31 is disposed on the gate electrode wire 10, the drain electrode wire 11, and the source electrode wire 12. The ground terminal wire 21 and the voltage division terminal wire 22 are disposed on the interlayer insulating film 31, and the ground contact portion 23 and the voltage division point contact portion 24 penetrate the interlayer insulating films 31 and 9 to reach the polysilicon resistor 20. The ground contact portion 23 and the voltage division point contact portion 24 are each chemically changed into a silicide by a reaction with the polysilicon resistor 20.

The outer peripheral end of the polysilicon resistor 20 is terminated such that the spiral wire 20b in the outermost circumference faces the overall outer side of at least the portion between the ground contact portion 23 and the voltage division point contact portion 24. The portion on an outer peripheral end side R2 from the ground contact portion 23 of the polysilicon resistor 20 is at the ground potential. The position of the outer peripheral end of the polysilicon resistor 20 is determined according to, for example, the design rule (a design criterion) of the gate polysilicon electrode 7. The distance from the spiral wire 20b in the outermost circumference of the polysilicon resistor 20 to the gate polysilicon electrode 7 in the outer side thereof may be, for example, 2 μm.

When the voltage level of the input pad of the JFET 30 is monitored using the voltage sensing circuit connected to the polysilicon resistor 20, preferably, the polysilicon resistor 20 is set to have a relatively high resistance value. The reason for this is the following two points. The first reason is that the outer peripheral end of the polysilicon resistor 20 is grounded and power consumption during standby of the IC is therefore determined by the current flowing through the polysilicon resistor 20. Power consumption during standby of the IC may be reduced by setting the resistance of the polysilicon resistor 20 to be high. The second reason is that the thickness t1 of the portion of the interlayer insulating film 9 sandwiched between the spiral wire 20b in the outermost circumference of the polysilicon resistor 20 and the source electrode wire 12 becomes smaller the smaller the design rule is, and breakdown is therefore more likely to occur. Concentration of the electric field on the interlayer insulating film 9 may be suppressed by setting the resistance of the polysilicon resistor 20 to be high.

When the IC is manufactured (produced) according to a design rule of, for example, 1 μm, the sheet resistance of the polysilicon resistor 20 may be set to be about 1.7 kilo Ohms per square (kΩ/□) and the thickness t1 of the portion sandwiched between the spiral wire 20b in the outermost circumference of the polysilicon resistor 20 and the source electrode wire 12 may be set to be about 1.5 μm. When the IC is manufactured according to a design rule of 0.35 μm, the sheet resistance of the polysilicon resistor 20 may be set to be about 8 kΩ/□ and the thickness t1 of the portion sandwiched between the spiral wire 20b in the outermost circumference of the polysilicon resistor 20 and the source electrode wire 12 may be set to be about 0.3 μm to 0.4 μm. The "design rule" refers to the minimal processing dimension of the width of each of, for example, the gate polysilicon electrode 7, the metal wires, and the contact holes.

As described later, the resistance value of the spiral wire 20b in the outermost circumference of the polysilicon resistor 20 varies because a greater amount is etched in the spiral wire 20b in the outermost circumference than in the spiral wire 20c on the inner circumference side (see FIG. 4) and the dangling bonds tend not to be terminated by hydrogen (H) atoms during the hydrogen annealing (see FIG. 5). Although the variation of the resistance value of the spiral wire 20b in the outermost circumference of the polysilicon resistor 20 becomes more significant as the resistance of the polysilicon resistor 20 is set to be higher (for example, equal to or higher than 1 kΩ/□), the portion having the varied resistance value is not used as a resistance element in the present invention (see FIG. 4). The resistance value of such a section is a voltage-divided resistance value, such as that from the ground contact portion 23 disposed in the spiral wire not covered by the source electrode wire 12, farther on the inner side than the spiral wire 20b in the outermost circumference of the polysilicon resistor 20, to the voltage division point contact portion 24.

In addition, the variation of the resistance value of the spiral wire 20b in the outermost circumference of the polysilicon resistor 20 becomes more significant as the thickness of the interlayer insulating film 9 is set to be smaller. The reason for this is as follows. The thickness t1 of the portion of the interlayer insulating film 9 sandwiched between the spiral wire 20b in the outermost circumference of the polysilicon resistor 20 and the source electrode wire 12 becomes smaller as the thickness of the interlayer insulating film 9 is set to be smaller. The rate of the hydrogen atoms occluded in the barrier metal in the lowermost layer of the source electrode wire 12 therefore becomes high during the hydrogen annealing, and the rate of the dangling bonds not terminated by the hydrogen atoms becomes high on the surface of the spiral wire 20b in the outermost circumference of the polysilicon resistor 20. The present invention is especially useful when the thickness of the interlayer insulating film 9 is small, for example, equal to or smaller than about 1.4 μm. The hydrogen annealing is thermal treatment in a hydrogen gas atmosphere executed to terminate the dangling bonds on the surface of the polysilicon resistor 20 using hydrogen atoms.

The resistance value of the polysilicon resistor 20 may be adjusted using the impurity concentration (the impurity dose amount) of the polysilicon resistor 20, the width w1 of the spiral wire, an interval w3 between the adjacent spiral wires, the number of turns of the spiral wire, and the like. For example, when the interval w3 between the adjacent spiral wires is excessively small or when the number of turns of the spiral wire is excessively great, the capacitance of the oxide films (the interlayer insulating film 9 and the LOCOS oxide film 8) is increased between the p-type semiconductor substrate 1 and the polysilicon resistor 20, and the operation velocity and the anti-noise property of the JFET 30 are degraded. Preferably, the above conditions for the polysilicon resistor 20 are set to avoid increase of the capacitance of the oxide films between the p-type semiconductor substrate 1 and the polysilicon resistor 20.

In the JFET 30, whether the JFET 30 is turned off is determined based on the potential of the voltage division terminal wire 22. For example, based on the potential of the voltage division terminal wire 22, the potential of the source electrode wire 12 is increased using the voltage sensing circuit not depicted that is electrically connected to the source electrode wire 12, and the pn-junction between the $n^+$-type source region 4 and the p-type gate region 2 is thereby inversely biased. The depletion layers stretching from the p-type gate regions 2 on both sides of the $n^+$-type source region 4 are thereby connected to each other at the contact face between the $n^+$-type source region 4 and the n-type drift region 3 (an interface portion of the $n^+$-type source region 4 with the n-type drift region 3). The current of the JFET 30 is thereby blocked and the JFET 30 is turned off.

Figure 4:
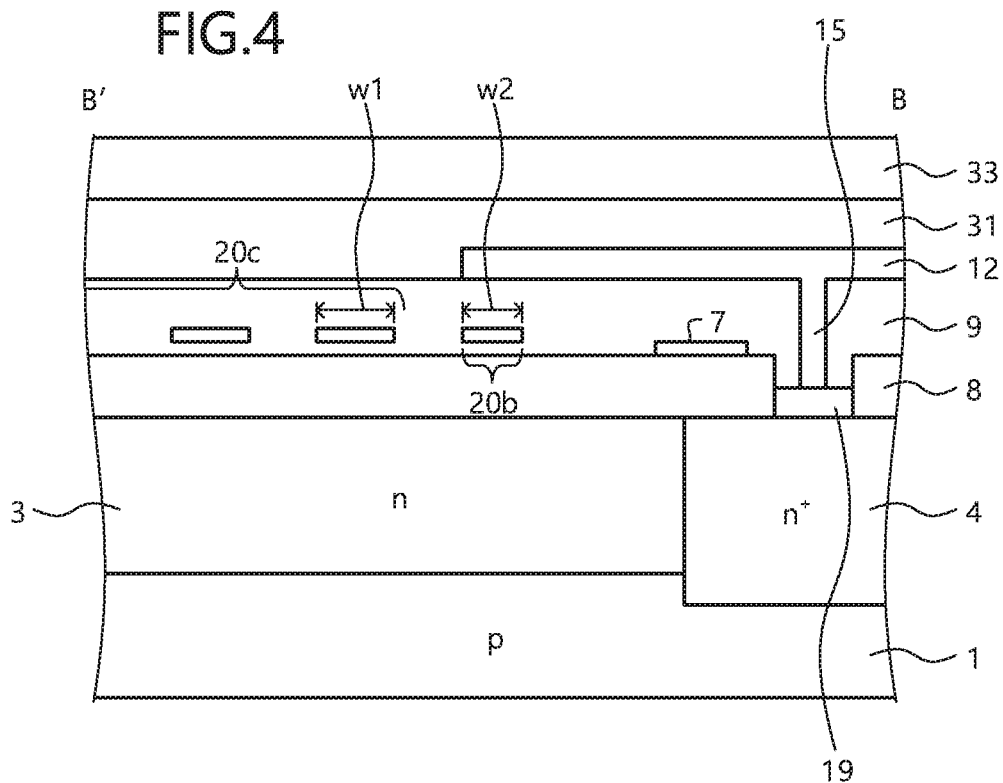
FIG. 4 is an enlarged cross-sectional view of a portion of the semiconductor device according to the first embodiment.

The JFET 30 and the polysilicon resistor 20 are fabricated according to a general CMOS manufacturing process simultaneously with the other active elements and passive elements that are manufactured on the same one semiconductor chip. FIG. 4 is an enlarged cross-sectional view of a portion of the semiconductor device according to the first embodiment. FIG. 5 is a cross-sectional view of the state in the course of the manufacture of the semiconductor device according to the first embodiment. FIGS. 4 and 5 each depict a vicinity of the spiral wire 20b in the outermost circumference of the polysilicon resistor 20 of FIG. 2. The polysilicon resistor 20 is disposed, for example, simultaneously with gate electrodes of the other elements that are manufactured on the same single semiconductor chip. As depicted in FIG. 4, at the etching step to pattern the polysilicon resistor 20 in the spiral planar shape, a width w2 of the spiral wire 20b in the outermost circumference becomes smaller than that of spiral wire 20c on the inner circumference side of the polysilicon resistor 20, and the spiral wire 20b in the outermost circumference whose width w2 is small is used as dummy polysilicon. The spiral wire 20c farther on the inner circumference side by one or more wire(s) than the spiral wire 20b in the outermost circumference is established with the predetermined width w1 by setting the spiral wire 20b in the outermost circumference of the polysilicon resistor 20 to be the dummy polysilicon.

The metal wires of the JFET 30 (the gate electrode wire 10, the drain electrode wire 11, and the source electrode wire 12) are disposed simultaneously with metal wires of the other elements manufactured on the same single semiconductor chip. The hydrogen annealing to terminate the dangling bonds on the surface of the polysilicon resistor 20 is therefore executed after the disposition of the metal wires to avoid adverse effects on other elements manufactured according to the same process on the same single semiconductor chip. Adverse effects of the hydrogen annealing on the other elements include, for example, fluctuation of the gate threshold value caused by the hydrogen atoms reaching the MOS gates of the other elements during the hydrogen annealing, or the like. As depicted in FIG. 5, the spiral wire 20b in the outermost circumference of the polysilicon resistor 20 is therefore covered by the source electrode wire 12 during the hydrogen annealing.

During the hydrogen annealing, hydrogen atoms 41 in the hydrogen gas atmosphere are blocked by the source electrode wire 12 and cannot pass through the source electrode wire 12. Hydrogen atoms 42 entering between the source electrode wire 12 and the polysilicon resistor 20 are occluded by the titanium film that is the barrier metal not depicted in the lowermost layer of the source electrode wire 12. Although dangling bonds cannot therefore be terminated and the resistance value varies in the portion covered by the source electrode wire 12 of the spiral wire 20b in the outermost circumference of the polysilicon resistor 20, the spiral wire 20b in the outermost circumference of the polysilicon resistor 20 is not used as a resistive element. Only the spiral wire 20c on the inner circumference side on which the dangling bonds are terminated by the hydrogen atoms 43 is used as the resistive element.

As described above, according to the first embodiment, no variation occurs of the resistance value of the resistive element caused by the process variation at the etching step to pattern the polysilicon resistor because the spiral wire in the outermost circumference of the polysilicon resistor is not used as any resistive element. According to the first embodiment, no variation occurs of the resistance value of the resistive element due to the hydrogen annealing to terminate the dangling bonds of the polysilicon resistor because the spiral wire covered by the source electrode wire, in the outermost circumference of the polysilicon resistor, is not used as a resistive element. Fluctuation of the resistance value of the resistive element caused by the increase of the potential of the source electrode wire may also be reduced. Variation of the potential of the voltage division terminal wire during the high-temperature and high-voltage application test or during the use of the product may therefore be prevented. According to the first embodiment, for example, when a circuit plan is prepared using computer aided design (CAD), the polysilicon resistor may be drawn automatically in a diagram to have the spiral planar shape based on a predetermined program by merely setting predetermined conditions. The design and the specification of the polysilicon resistor therefore may be changed easily.

The structure of a semiconductor device according to a second embodiment will be described. FIG. 6 is a plan diagram of a planar layout of a main portion of the semiconductor device according to the second embodiment. The semiconductor device according to the second embodiment differs from the semiconductor device according to the first embodiment in that a portion farther on the outer peripheral end side R2 than the ground contact portion 23 of the polysilicon resistor 20 is cut off to be at a floating potential.

The portion farther on the outer peripheral end side R2 than a cut-off point 25 of the polysilicon resistor 20 is at the floating potential. The potential farther on the inner peripheral end side R1 than the cut-off point 25 of the polysilicon resistor 20 is not applied to a portion immediately beneath (on the side of the polysilicon resistor 20) the jutting portion jutting to the inner side of the source electrode wire 12. Breakdown can therefore be suppressed near the jutting portion jutting to the inner side of the source electrode wire 12.

The portion farther on the outer peripheral end R2 than the cut-off point 25 of the polysilicon resistor 20 may have reduced resistance by being chemically changed into a silicide or by setting the impurity concentration thereof to be high.

In a case where the cut off portion 25 is disposed in the polysilicon resistor 20 as described above, for example, when a circuit plan is prepared using CAD, the polysilicon resistor 20 is automatically drawn in a diagram to have the spiral planar shape based on a predetermined program. The circuit plan merely has to be again drawn after setting the positional conditions for the cut-off point 25 of the polysilicon resistor 20.

As described above, according to the second embodiment, the same effect as that of the first embodiment may be achieved.

The structure of a semiconductor device according to the third embodiment will be described. FIG. 7 is a plan diagram of a planar layout of a main portion of the semiconductor device according to the third embodiment. The semiconductor device according to the third embodiment differs from the semiconductor device according to the second embodiment in that the ground contact portion 23 and the voltage division point contact portion 24 are disposed respectively in polysilicon layers 27 and 28 that extend outward from the spiral wire of the polysilicon resistor 20.

Similar to the first embodiment, the polysilicon layers 27 and 28 extend outward from the spiral wire 20c farther on the inner circumference side by one or more wire(s) than the spiral wire 20b of the outermost circumference of the polysilicon resistor 20, and take out potentials at the connection points with the polysilicon resistor 20. The polysilicon layers 27 and 28 each have their resistance reduced by being chemically changed into a self-aligned silicide (salicide) or by increasing the impurity concentrations thereof to be higher than that of the polysilicon resistor 20. A cut-out portion 12a may be disposed in the source electrode wire 12 to avoid facing of the ground contact portion 23 and the voltage division point contact portion 24 with the source electrode wire 12 in the depth direction.

The polysilicon resistor 20 may further include cut-off points 26a and 26b in a portion having the ground terminal wire 21 and the voltage division terminal wire 22 intersecting each other. The polysilicon resistor 20 is at the floating potential near the ground contact portion 23 and the voltage division point contact portion 24, and the variation of the potential of each of the ground contact portion 23 and the voltage division point contact portion 24 may thereby be suppressed.

When the polysilicon resistor 20 includes the cut-off points 26a and 26b in the portion thereof having the ground terminal wire 21 and the voltage division terminal wire 22 intersecting each other, the polysilicon resistor 20, the ground terminal wire 21, and the voltage division terminal wire 22 may be disposed in the same layer.

Although not depicted, the source electrode wire 12, the ground terminal wire 21, and the voltage division terminal wire 22 may be disposed in the same single layer. In this case, cut-out portions only have to be disposed in intersection portions of the source terminal wire 12 with the ground terminal wire 21 and the voltage division terminal wire 22.

The third embodiment may be applied to the first embodiment.

As described above, according to the third embodiment, the same effects as those of the first embodiment may be achieved. According to the third embodiment, the ground terminal wire and the voltage division terminal wire may be disposed away from the spiral wire of the polysilicon resistor. The rate of the hydrogen atoms occluded in the barrier metals of the ground terminal wire and the voltage division terminal wire may therefore be reduced during the hydrogen annealing, and variation of the resistance value of the resistive element may be suppressed further. According to the third embodiment, the surface area of each of the contact portions with the ground terminal wire and the voltage division terminal wire may be increased. The third embodiment is therefore useful for a case where the design rule is large (for example, a design rule of 1 μm) and the surface area of each of the contact portions is large.

The structure of a semiconductor device according to a fourth embodiment will be described. FIG. 8 is a plan diagram of a planar layout of a main portion of the semiconductor device according to the fourth embodiment. The semiconductor device according to the fourth embodiment differs from the semiconductor device according to the first embodiment in that three or more terminal wires are electrically connected each through a contact portion to the spiral wire 20c farther on the inner circumference side by one or more wires than the spiral wire 20b in the outermost circumference of the polysilicon resistor 20. FIG. 8 depicts a case where the three terminal wires (the resistor connection wires) 51 to 53 are disposed. Reference numerals 54 to 56 respectively denote the contact portions for the terminal wires 51 to 53 with the polysilicon resistor 20, and the contact portions 54 to 56 are each chemically changed into a silicide to have reduced resistance.

In this case, the terminal wire 51 disposed on the outer peripheral end side R2 of the polysilicon resistor 20 may be used as the ground terminal wire and either the other terminal wire 52 or 53 may be selected using an external circuit such as, for example, a trimming circuit to be used as the voltage division terminal wire. Alternatively, an external circuit may first select, for example, the terminal wire 52 to be the ground terminal wire and the terminal wire 53 to be the ground terminal wire may thereafter be selected from plural terminal wires farther on the inner peripheral end side R1 of the polysilicon resistor 20 than the terminal wire 52 to be the ground terminal wire. The convenience of the polysilicon resistor 20 may thereby be improved.

The terminal wires 51 to 53 may be used each as a terminal to take out a signal at a potential that is different from another. The fourth embodiment may be applied to the second and the third embodiments.

As described above, according to the fourth embodiment, the same effects as those of the first embodiment may be achieved.

Example 1 will be described. The impurity dose amount for the polysilicon resistor was verified. FIG. 9 is an explanatory diagram of the relation between the impurity dose amount [$cm^{-2}$] and the sheet resistance [$\Omega/\square$] of the resistive element. The horizontal axis of FIG. 9 represents the impurity dose amount for the polysilicon resistor and the vertical axis thereof represents the sheet resistance of the polysilicon resistor. The thickness of the polysilicon resistor used as a specimen was 200 nm. The hydrogen annealing was executed to terminate the dangling bonds on the surface of the polysilicon resistor.

From the results depicted in FIG. 9, it was confirmed that the sheet resistance significantly varied when the sheet resistance of the polysilicon resistor was equal to or higher than 1 k$\Omega/\square$ (in FIG. 9, a horizontal dotted line 61 indicates the sheet resistance=1 k$\Omega/\square$ (=1.0×10$^3$$\Omega/\square$)). The sheet resistance value varied due to the variation of the impurity dose amount for the polysilicon resistor in the course of the manufacture when the sheet resistance of the polysilicon resistor was equal to or higher than 1 k$\Omega/\square$. The variation rate of the sheet resistance to the impurity dose amount for the polysilicon resistor became significantly great when the sheet resistance was equal to or higher than 2 k$\Omega/\square$ (in FIG. 9, a horizontal dotted line 62 indicates the sheet resistance=2 k$\Omega/\square$ (=2.0×10$^3$$\Omega/\square$)).

The present invention is effective for a case where the polysilicon resistor 20 having the sheet resistance equal to or higher than 1 k$\Omega/\square$ is disposed. The present invention is further effective for a case where the polysilicon resistor 20 having the sheet resistance equal to or higher than 2 k$\Omega/\square$ is disposed.

Example 2 will be described. Verification was executed for the thickness t1 of the portion of the interlayer insulating film 9 sandwiched between the spiral wire 20b in the outermost circumference of the polysilicon resistor 20 and the source electrode wire 12. FIG. 10 is a characteristics diagram of the relation between the impurity dose amount for the polysilicon resistor and the variation of the sheet resistance of the resistive element. The horizontal axis of FIG. 10 represents the impurity dose amount for the polysilicon resistor. The vertical axis of FIG. 10 represents a fluctuation rate ΔRs [%] of the sheet resistance of the resistive element constituted by the polysilicon resistor 20, relative to the sheet resistance acquired when the source electrode wire 12 was not disposed on the polysilicon resistor 20.

The thickness of the polysilicon resistor 20 was 200 nm. The hydrogen annealing was executed to terminate the dangling bonds on the surface of the polysilicon resistor 20. The interlayer insulating film 9 sandwiched by the polysilicon resistor 20 and the source electrode wire 12 included an oxide film and the thickness thereof was 1.4 μm.

From the result depicted in FIG. 10, it was confirmed that the sheet resistance of the polysilicon resistor 20 significantly fluctuated when the impurity dose amount for the polysilicon resistor 20 was equal to or smaller than 5×10$^{15}$/cm$^2$. In addition, when the impurity dose amount for the polysilicon resistor 20 was equal to or smaller than 5×10$^{14}$/cm$^2$, the fluctuation of the sheet resistance of the polysilicon resistor 20 became conspicuous. In FIG. 10, a reference numeral "63" denotes the position indicating the impurity dose amount=5×10$^{14}$/cm$^2$ for the polysilicon resistor 20.

The present invention is therefore effective for a case where the thickness t1 of the portion of the interlayer insulating film 9 sandwiched by the polysilicon resistor 20 and the source electrode wire 12 is equal to or smaller than 1.4 μm and the impurity dose amount for the polysilicon resistor 20 is equal to or smaller than $5\times10^{15}$/cm$^2$. The present invention is further effective for the case where the thickness t1 of the portion of the interlayer insulating film 9 sandwiched by the polysilicon resistor 20 and the source electrode wire 12 is equal to or smaller than 1.4 μm and the impurity dose amount for the polysilicon resistor 20 is equal to or smaller than $5\times10^{14}$/cm$^2$.

In the embodiments, although semiconductor devices each using a JFET have been described, the present invention is also applicable to an insulated gate transistor (metal oxide semiconductor field effect transistor (MOSFET)) instead of the JFET. In the fifth embodiment, the structure of the MOSFET will be described taking an example of an n-channel MOSFET with reference to FIG. 11.

Figure 11:
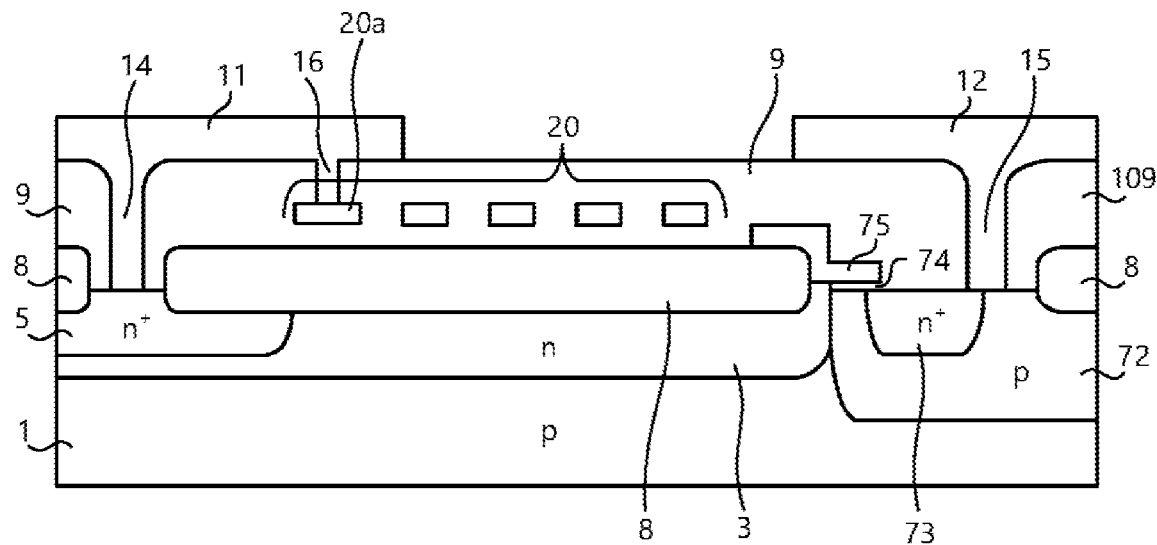
FIG. 11 is a cross-sectional view of the structure of the semiconductor device according to a fifth embodiment.

FIG. 11 is a cross-sectional view of the structure of the semiconductor device according to a fifth embodiment. The semiconductor device according to the fifth embodiment is the n-channel MOSFET to which the first embodiment is applied. The semiconductor device according to the fifth embodiment depicted in FIG. 11 includes a MOS gate (an insulated gate including a metal oxide film semiconductor) structure that includes a p-type base region 72, an n$^+$-type source region 73, a gate insulating film 74, and a gate polysilicon electrode 75. The planar layout of the semiconductor device according to the fifth embodiment depicted in FIG. 11 is same as that of the first embodiment (see FIG. 1). The p-type gate region in the JFET of the first embodiment (corresponding to the reference numeral "2" of FIG. 2) corresponds to the p-type base region 72 in the fifth embodiment.

The p-type base region 72 acts as a channel region in which an n-type inversion layer (a channel) is formed during the on-state. The n$^+$-type source region 73 is disposed to have an annular planar shape, on the circumference at equal intervals from the n$^+$-type drain region 5 in the surface layer in the p-type base region 72. The n$^+$-type source region 73 is disposed as one continuous region. The p-type base region 72 and the n$^+$-type source region 73 therein therefore appear in any cross section acquired by cutting the semiconductor device along a cutting line (for example, the cutting line A-A') that corresponds to a radius in the planar layout of FIG. 1. The n$^+$-type source region 73 and the n$^+$-type drain region 5 are simultaneously disposed using diffusion and the depth of these regions 73 and 5 is smaller than the depth of the n-type drift region 3 and the p-type base region 72. The n$^+$-type drain region 5 may be omitted.

The p-type base region 72 contacts the n-type drift region 3. The gate polysilicon electrode 75 to be a control electrode is disposed through the gate insulating film 74 on the surface of the p-type base region 72, at a portion sandwiched between the n-type drift region 3 and the n$^+$-type source region 73. The gate polysilicon electrode 75 is drawn onto the surface of the LOCOS oxide film 8 in a cross section different from that of FIG. 11 and is connected to a gate electrode wire not depicted. Similar to the first embodiment, inside the interlayer insulating film 9, the polysilicon resistor 20 is disposed in the portion that faces the n-type drift region 3 in the depth direction, sandwiching the LOCOS oxide film 8 therebetween.

A metal wire to be the source electrode wire 12 is electrically connected to the p-type base region 72 and the n$^+$-type source region 73 through the source contact portion 15 and the contact plug not depicted that penetrate the interlayer insulating film 9. Similarly to the first embodiment, a metal wire to be the drain electrode wire 11 is electrically connected to the n$^+$-type drain region 5 through the drain contact portion 14 and the contact plug not depicted that penetrate the interlayer insulating film 9. Similar to the first embodiment, the drain electrode wire 11 is electrically connected to the spiral wire 20a in the innermost circumference of the polysilicon resistor 20 through the resistive element contact portion 16 that penetrates the interlayer insulating film 9.

Figure 12:
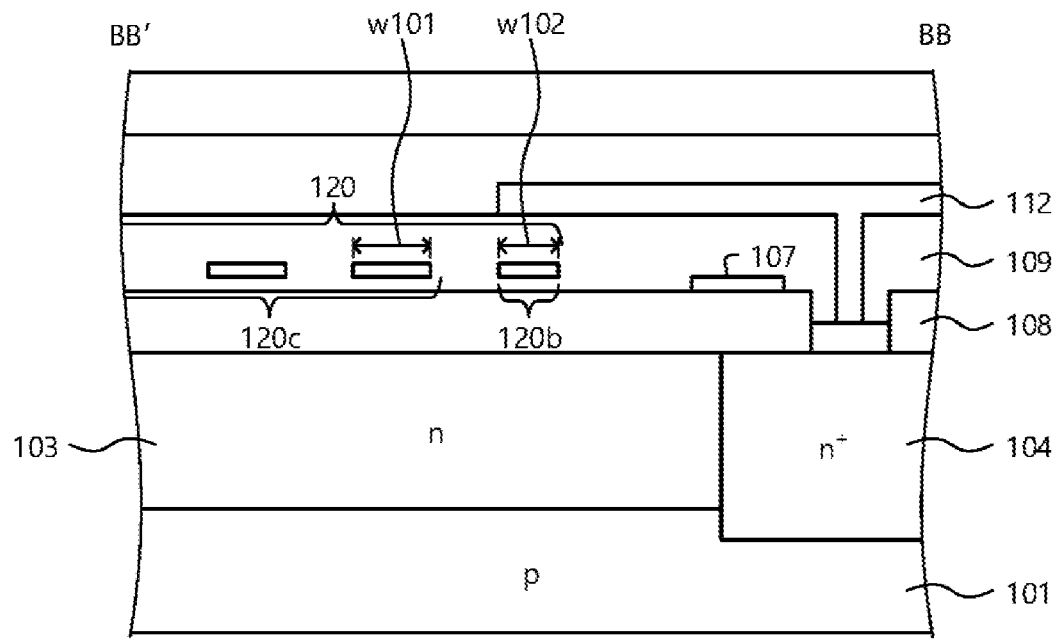
FIG. 12 is an explanatory diagram of a problematic point of a conventional semiconductor device.
Figure 13:
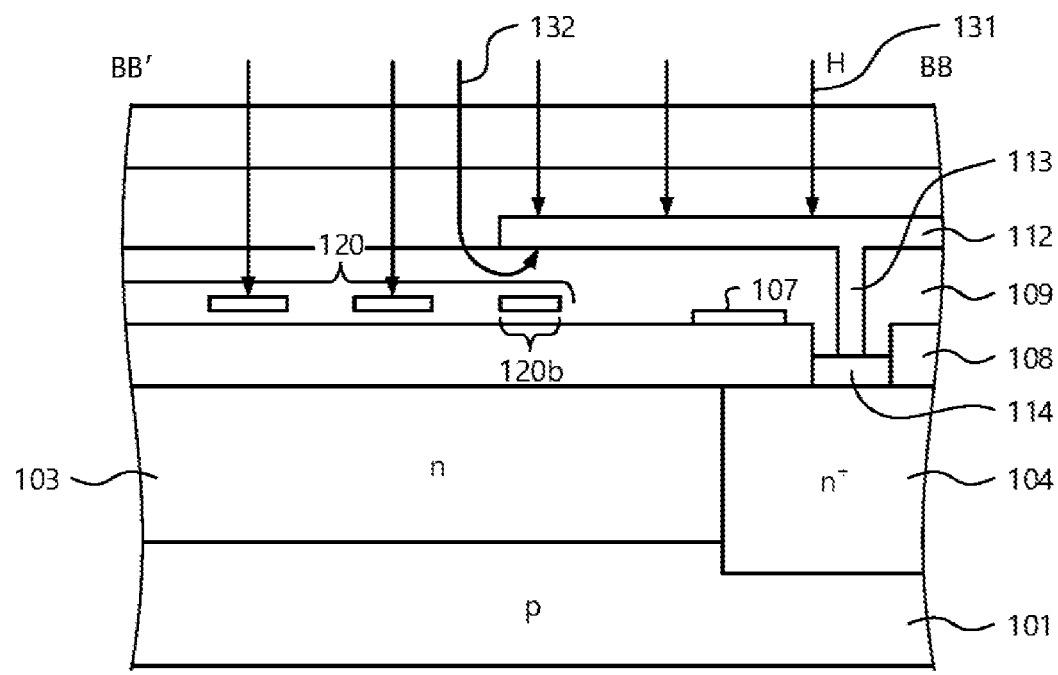
FIG. 13 is a cross-sectional view of the problematic point in the course of manufacture of the conventional semiconductor device.
Figure 14:
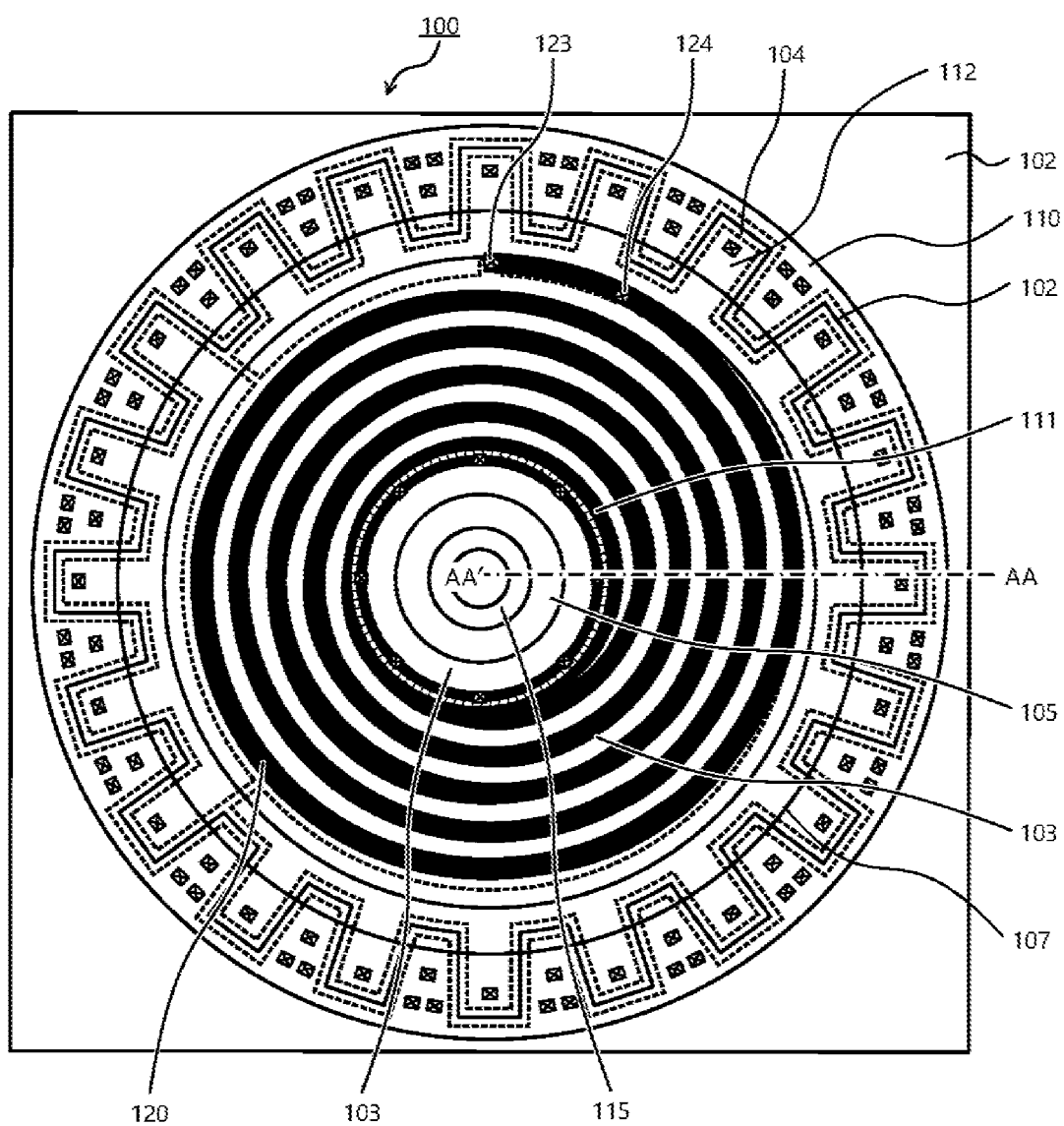
FIG. 14 is a plan diagram of a planar layout of the conventional semiconductor device.
Figure 15:
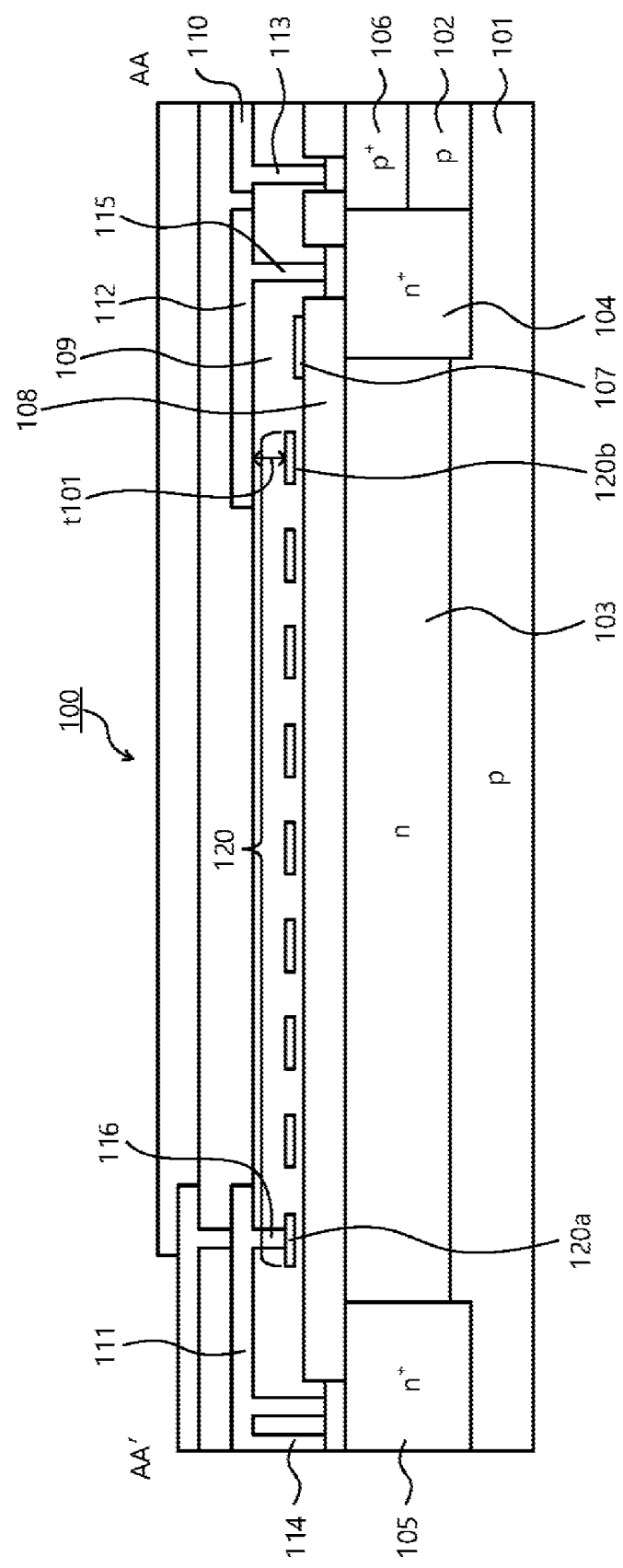
FIG. 15 is a cross-sectional view taken along a cutting line AA-AA' in FIG. 14.
Figure 16:
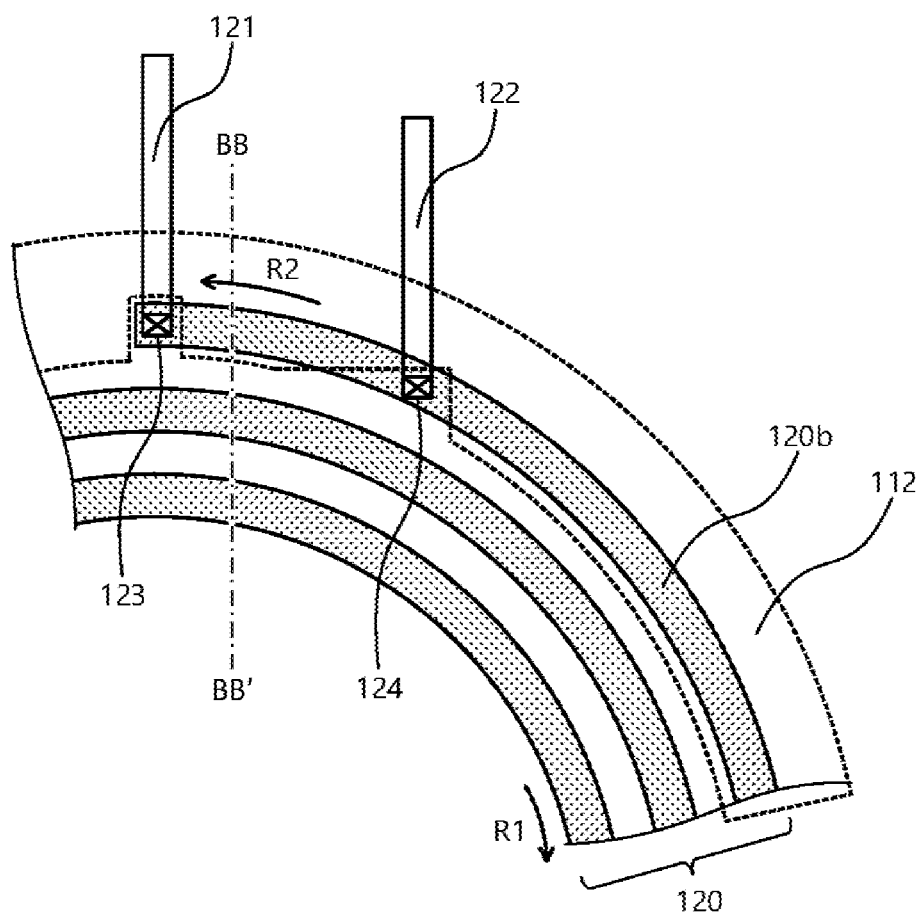
FIG. 16 is an enlarged plan diagram of a portion of FIG. 14.

However, in the conventional JFET 100 (see FIGS. 14 to 16), the ground point (the ground contact portion 123) and the voltage division point (the voltage division point contact portion 124) are disposed in the outermost circumference 120b of the polysilicon resistor 120 and the following problems therefore arise. FIG. 12 is an explanatory diagram of the problematic point of the conventional semiconductor device. FIG. 13 is a cross-sectional view of the problematic point in the course of the manufacture of the conventional semiconductor device. FIGS. 12 and 13 each depict in an enlarged view of the vicinity of the outermost circumference 120b of the polysilicon resistor 120 of FIG. 15. At an etching step to pattern the polysilicon resistor 120 into a spiral planar shape, a greater amount is etched in the outermost circumference 120b than on an inner circumference side 120c of the polysilicon resistor 120 due to the nature of this process. As depicted in FIG. 12, a width w102 of a spiral wire in the outermost circumference 120b tends to be small compared to a width w101 of a spiral wire on the inner circumference side 120c (w101>w102) and the resistance value tends to vary in the outermost circumference 120b of the polysilicon resistor 120.

Thermal treatment in a hydrogen gas atmosphere executed to terminate dangling bonds (uncoupled bonds) of the surface of the polysilicon resistor 120 with hydrogen (H) atoms (hereinafter, referred to as "hydrogen annealing") has to be executed. As depicted in FIG. 13, the outermost circumference 120b of the polysilicon resistor 120 is covered with the source electrode wire 112. During the hydrogen annealing, hydrogen atoms 131 in the hydrogen gas atmosphere are therefore blocked by the source electrode wire 112 and cannot pass through the source electrode wire 112. Hydrogen atoms 132 entering between the source electrode wire 112 and the polysilicon resistor 120 are absorbed by a titanium (Ti) film to be a barrier metal not depicted in the lowermost layer of the source electrode wire 112. No dangling bond can therefore be terminated and the resistance value varies in the portion covered by the source electrode wire 112, of the outermost circumference 120b of the polysilicon resistor 120.

When the polysilicon resistor 120 is used as a resistive element to monitor the input voltage to the input pad (the drain electrode wire 111) of the JFET 100, the potential of the source electrode wire 112 is increased to set the JFET 100 to be in an off-state during a high-temperature and high-voltage application test or during the use of the product. In this case, the resistance value of the portion covered by the source electrode wire 112, of the outermost circumference 120b of the polysilicon resistor 120 fluctuates consequent to the adverse effect of the increase of the potential of the source electrode wire 112. The resistance value of the outermost circumference 120b of the polysilicon resistor 120 varies or fluctuates as above and the resistance value (divided voltage resistance) from the ground contact portion 123 of the polysilicon resistor 120 to the voltage division point contact portion 124 therefore varies. The potential of the voltage division point therefore varies and the property of the JFET 100 fluctuates. A problem therefore arises that the reliability of the JFET 100 is degraded.

According to the present invention, no variation of the resistance value of the resistive element due to the variation of the processing at the etching step to pattern the resistive body occurs because a portion of the resistive body other than the portion covered by the third electrode is used as the resistive element. No variation of the resistance value of the resistive element occurs due to the hydrogen annealing to terminate the dangling bonds of the resistive body. In addition, fluctuation of the resistance value of the resistive element caused by the increase of the potential of the third electrode may be reduced.

According to the semiconductor device of the present invention, an effect is achieved that the reliability thereof may be improved.

In the description above, although the present invention has been described taking the example of the resistive element for the voltage sensing of the start-up element of the start-up circuit, the present invention is applicable to all the circuits each using a polysilicon resistor disposed to have a spiral planar shape as a resistive element. In the embodiments, although the first conductivity type is set to be the p-type and the second conductivity type is set to be the n-type, the present invention is further implemented when the first conductivity type is set to be the n-type and the second conductivity type is set to be the p-type.

As described above, the semiconductor device according to the present invention is useful for semiconductor devices used in power converting equipment such as converters and inverters, and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
    a first region of a first conductivity type, selectively disposed in a surface layer of a semiconductor substrate;
    a second region of a second conductivity type, disposed in the surface layer of the semiconductor substrate in contact with the first region;
    a third region of the second conductivity type, disposed in the surface layer of the semiconductor substrate to face the second region;
    a fourth region of the second conductivity type, disposed in the surface layer of the semiconductor substrate, between the first region and the third region;
    an insulating film covering the fourth region;
    a resistive body embedded in the insulating film and being made of a continuous wire forming a plurality of spiral turns at a same layer with a planar shape;
    a first electrode electrically connected to the third region and an innermost end of the resistive body;
    a second electrode electrically connected to the second region and covering an outermost end side of the resistive body through the insulating film;
    a third electrode electrically connected to the first region; and
    a plurality of resistor connection wires each electrically connected to a portion of the resistive body, on a side closer to the first electrode than a portion covered by the second electrode, wherein
    no resistor connection wire of the plurality of resistor connection wires is connected to an outermost complete turn of the resistive body, and
    the resistive body is a polysilicon resistor.

2. The semiconductor device according to claim 1, wherein
    the second electrode covers the outermost end of the resistive body through the insulating film, and each of the plurality of resistor connection wires is electrically connected to a corresponding one of the plurality of spiral turns of the continuous wire, each of the corresponding one of the plurality of spiral turns being other than the outermost complete turn of the continuous wire of the resistive body.

3. The semiconductor device according to claim 1, wherein at least one of the plurality of resistor connection wires is electrically connected to the resistive body through a polysilicon layer drawn in a direction away from the continuous wire of the resistive body, and the polysilicon layer is a resistance layer chemically changed to a salicide or has an impurity concentration set to be higher than an impurity concentration of the resistive body.

4. The semiconductor device according to claim 1, wherein sheet resistance of the resistive body is equal to or higher than 1 kΩ/□.

5. The semiconductor device according to claim 1, wherein the second electrode and the third electrode are connected to each other.

6. A semiconductor device comprising:
    an insulating film disposed on a surface of a semiconductor substrate;
    a resistive body disposed in the insulating film and having a spiral planar shape, the resistive body being made of a continuous wire forming a plurality of spiral turns at a same layer;
    a first electrode electrically connected to an innermost end of the resistive body; and
    a plurality of resistor connection wires that are each electrically connected to the continuous wire of the resistive body farther on an inner circumference side by one or more turns of the continuous wire than an outermost complete turn of the resistive body,
    wherein at least one of the plurality of resistor connection wires is a ground terminal wire,
    no resistor connection wire of the plurality of resistor connection wires is connected to the outermost complete turn of the resistive body, and
    the resistive body is a polysilicon resistor.

7. The semiconductor device according to claim 6, wherein at least one of the plurality of resistor connection wires is electrically connected to the resistive body through a polysilicon layer drawn in a direction away from the continuous wire of the resistive body, and the polysilicon layer is a resistance layer chemically changed to a salicide or has an impurity concentration set to be higher than an impurity concentration of the resistive body.

8. The semiconductor device according to claim 6, wherein sheet resistance of the resistive body is equal to or higher than 1 kΩ/□.

9. The semiconductor device according to claim 6, wherein each of the plurality of resistor connection wires is electrically connected to a same loop of the continuous wire.

10. The semiconductor device of claim 6, wherein the plurality of resistor connection wires extend across the outermost complete turn of the resistive body to electrically connect to the continuous wire of the resistive body farther on the inner circumference side by one or more turns of the continuous wire than the outermost complete turn of the resistive body.

\* \* \* \* \*